United States Patent
Chi et al.

(10) Patent No.: US 7,009,185 B2
(45) Date of Patent: Mar. 7, 2006

(54) ULTRAVIOLET DETECTOR AND MANUFACTURE METHOD THEREOF

(75) Inventors: Gou-Chung Chi, Hsinchu (TW);
Iinn-Kong Sheu, Tainan (TW);
Meng-Che Chen, Taichung (TW);
Min-Lum Lee, Tainan (TW)

(73) Assignee: National Central University, Taoyuan (TW)

( * ) Notice: Subject to any disclaimer, the term of this patent is extended or adjusted under 35 U.S.C. 154(b) by 355 days.

(21) Appl. No.: 10/622,348

(22) Filed: Jul. 19, 2003

(65) Prior Publication Data

US 2004/0195518 A1     Oct. 7, 2004

(30) Foreign Application Priority Data

Apr. 2, 2003    (TW) .............................. 92107536 A

(51) Int. Cl.
*G01J 1/42*     (2006.01)
(52) U.S. Cl. .......................... 250/372; 257/463; 438/93
(58) Field of Classification Search ............... 438/93; 257/463

See application file for complete search history.

(56) References Cited

U.S. PATENT DOCUMENTS 5,923,953 A * 7/1999 Goldenberg Barany et al. ................ 438/93

6,849,862 B1 * 2/2005 Nikolaev et al. ............. 257/14

OTHER PUBLICATIONS

Planar GaN $n^{30}$ -$p$ photodetectors formed by Si implantation into $p$-GaN J. K. Sheu, M. L. Lee, L. S. Yeh, C. J. Kao, C. J. Tun, M. G. Chen, G. C. Chi, S. J. Chang, Y. K. Su, and C. T. Lee Department of Physics, National Central University, Chung-Li 320, Taiwan, Republic of China (Received May 6, 2002; accepted Oct. 7, 2002).

* cited by examiner

Primary Examiner—David Porta
Assistant Examiner—Djura Malevic

(57) ABSTRACT

The present invention relates to an ultraviolet detector and manufacture method thereof, in which a buffer layer is formed on a baseplate and a P-type GaN layer is formed on the baseplate by using epitaxial method. By availing ion-distribution-and-vegetation technology, a first N-type GaN layer is vegetated and invested in the P-type GaN layer by distributing and vegetating $Si^+$ ions in that layer, and a second N-type GaN layer having a thicker ion concentration is invested in the N-type GaN layer. Finally, an annular and a circular metallic layer are formed between the P-type GaN layer and the first N-type GaN layer as well as inside the second N-type GaN layer, respectively, to serve for respective ohmic contact layers. The present invention is characterized in that an incident light can project upon a depletion layer of the GaN planar structure to have the detection efficiency significantly improved.

8 Claims, 4 Drawing Sheets

ULTRAVIOLET DETECTOR AND MANUFACTURE METHOD THEREOF

BACKGROUND OF THE INVENTION

1. Field of the Invention

The present invention relates generally to an ultraviolet detector and manufacture method thereof, and more particularly to that capable of improving photon efficiency and simplifying manufacture process to raise yield, lower down cost, and promote the function of photoelectric elements through an ion-distribution technology by vegetating an N-type GaN (Gallium nitride) layer in a P-type GaN layer and creating a planar structure containing P-type and N-type GaN layers on the top face of the element to enable an incident light, such as an ultraviolet beam, to enter a depletion layer directly for easy detection.

2. The Prior Arts

An incident light is applied to penetrate through a P-type and an N-type semiconductor layer when a photoelectric element for photo-detection is in operation. In the case the photon energy of a incident light is larger than a band gap of the semiconductor material, the photon energy will be absorbed by the material to create an electron-hole pair, which is driven to produce a current for detecting the incident light if an external voltage is applied. Generally, a P-type or an N-type semiconductor layer in a photoelectric element for light detection is vegetated by multi-layer epitaxial technology.

SUMMARY OF THE INVENTION

As mentioned above, a conventional P-type or N-type semiconductor layer in a photoelectric element for light detection is generally a multi-layer structure vegetated by multi-layer epitaxial technology, therefore, an incident light is stopped from projecting upon a depletion layer of the element directly to thereby deteriorate the detection efficiency. Another weakness of the multi-layer epitaxial technology is the complicatedness and relatively high cost in manufacture.

Therefore, a primary object of the present invention is to provide an ultraviolet detector and manufacture method thereof for eliminating the defects of the conventional devices.

In order to realize the above objects, an ultraviolet detector of the present invention comprises a baseplate, a buffer layer, and a P-type GaN layer, in which the P-type GaN layer envelops a first N-type GaN layer extended to the top end of the detector, and the first N-type GaN layer further envelops a second N-type GaN layer, which is also extended to the top end mentioned and capable of releasing much more electrons. Besides, an annular metallic layer is formed on the top end in an intermediate zone between the P-type GaN layer and the first N-type GaN layer to serve for a P-type ohmic contact electrode, while another metallic layer is formed in the most inner zone inside the second N-type GaN layer to serve for an N-type ohmic contact electrode, such that a planar structure including a P-type and an N-type GaN layer is formed on the top end of the detector for promoting the photon efficiency.

Moreover, the manufacture method of the ultraviolet detector of the present invention is to introduce a buffer layer on an insulating baseplate, then form a P-type GaN layer on the buffer layer by epitaxial method, distribute and vegetate an N-type GaN layer with $Si^+$ ions in the P-type GaN layer properly using ion-distribution-and-vegetation technology, and form another N-type GaN layer capable of releasing much more electrons invested in foregoing N-type GaN layer. After this, the method is to put the semi-finished produce into a high-temperature furnace for annealing to activate the vegetated ions, and finally, plate an annular metallic layer and another metallic layer on the top end of the detector in an intermediate zone between the P-type GaN layer and the first N-type GaN layer as well as another metallic layer in the most inner zone inside the second N-type GaN layer to serve for a P-type and an N-type ohmic contact electrode respectively, so that the manufacture process is improved, cost is lowered, and yield is raised.

The merits of the present invention may be summarized as follows:

(1) The planar structure formed by P-type and N-type GaN layer on the top end of the detector permits an incident light to project upon a depletion layer directly to thereby promote photon efficiency.

(2) It is possible for the method of the present invention to vegetate an N-type GaN layer in a P-type GaN layer and form a planar structure composed of a P-type and N-type GaN layer on the top end of the detector of the present invention by using ion-distribution-and-vegetation technology, such that process can be improved and yield can be promoted.

For more detailed information regarding advantages or features of the present invention, at least an example of preferred embodiment will be described below with reference to the annexed drawings.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

At least a preferred embodiment is described below with reference to the annexed drawings, in which partial measurements are exaggeratedly expressed for easy viewing.

Figure 1A:
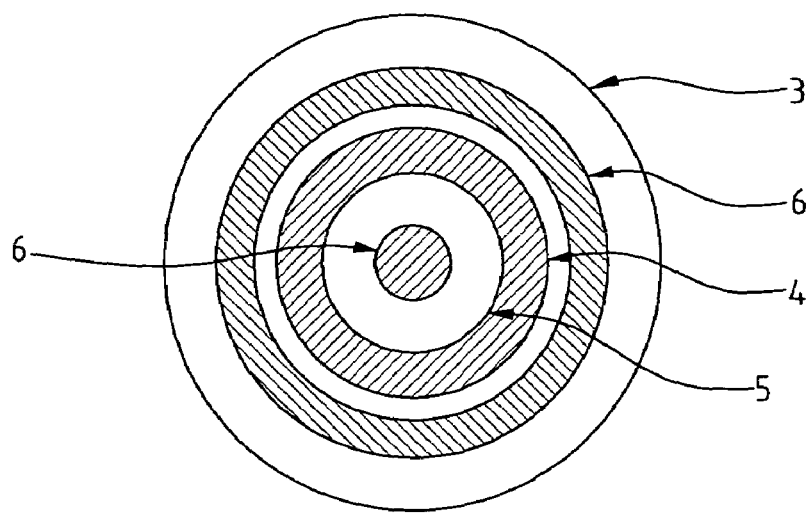
FIG. 1A is a top view of an ultraviolet detector of the present invention.
Figure 1B:
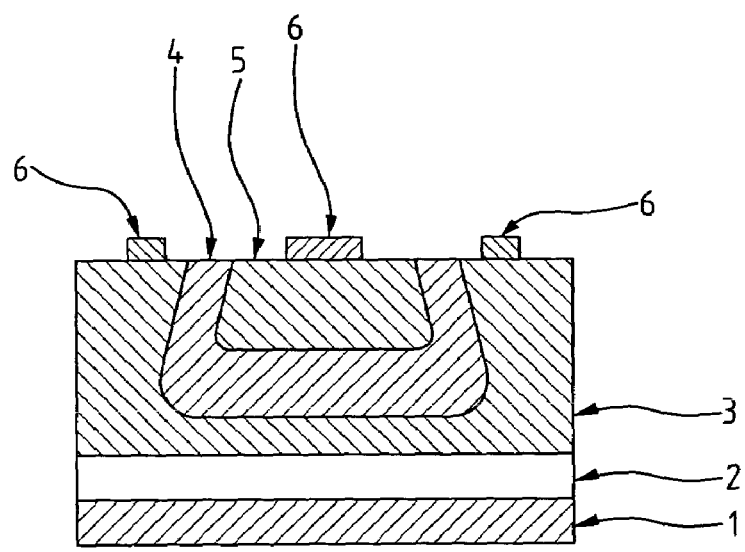
FIG. 1B is a cutaway sectional view of the ultraviolet detector of the present invention.

As illustrated in an embodiment of an ultraviolet detector of the present invention shown in FIGS. 1A and 1B, the detector is comprised of a baseplate 1, a buffer layer 2, and a P-type GaN layer 3. Enclosed by the P-type GaN layer 3, a first N-type GaN layer 4 is extended to the top end of the P-type GaN layer 3, and in turn, a second N-type GaN layer 5 enclosed by the first N-type GaN layer 4 is also extended to the top end. Moreover, untouched to and outside of the first N-type GaN layer 4, an annular metallic layer 6 is formed on the top end of the P-type GaN layer 3. Also, another metallic layer 6 is formed on the top end within the scope inside the second N-type GaN layer 5.

Figure 2:
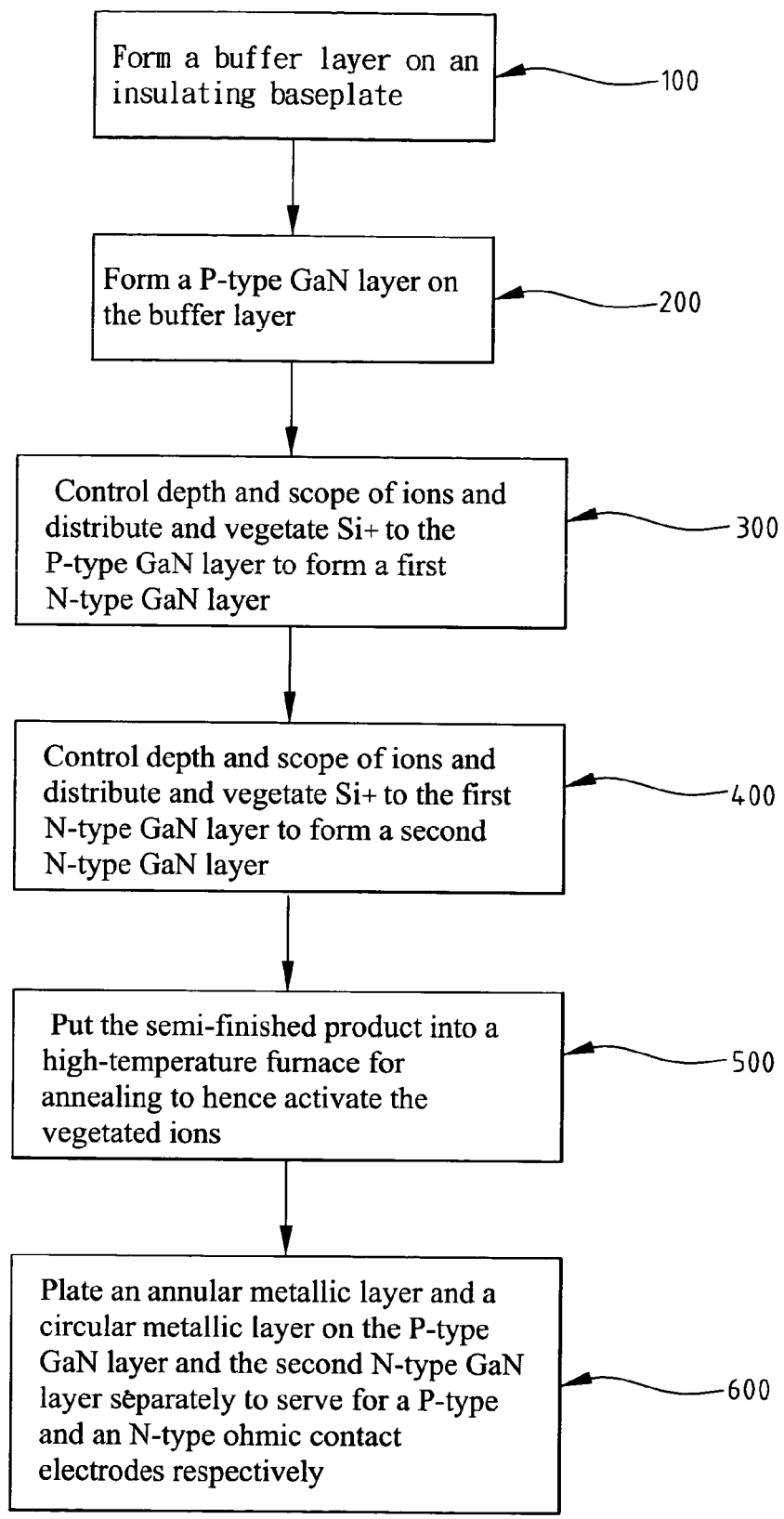
FIG. 2 is a flowchart showing the manufacture process of the ultraviolet detector of the present invention.

Also referring to FIG. 2, the manufacture process of the ultraviolet detector of the present invention comprises the following steps, labeled with reference numerals 100–600 in FIG. 2.

Figure 3:
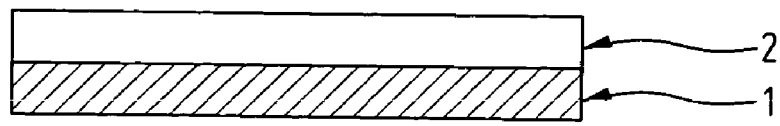
FIGS. 3–6 show the schematic manufacture process of the ultraviolet detector of the present invention.

In step 100, a buffer layer 2 is formed on the insulating baseplate 1 by way of an epitaxial method (see FIG. 3), in which the baseplate 1 is made of Si, SiC, Gap, GaAs, GaN, $Al_2O_3$, and the likes.

Figure 4:
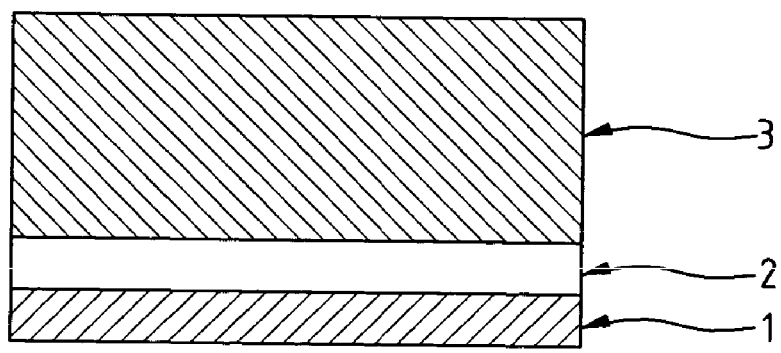

In step 200, a P-type GaN layer 3 is formed on the buffer layer 2 by way of the same epitaxial method (see FIG. 4), in which the epitaxial method may be MOCVD (metal organic chemical vapor deposition), molecular beam epitaxy, VPE (vapor phase epitaxy), or LPE (liquid phase epitaxy) and the P-type GaN layer 3 may be formed by the P-type material of $Al_xGa_yIn_{(1-x-y)}N$, where $x \geq 0$, $y \geq 0$, $1 \geq x+y \leq 0$.

Figure 5:
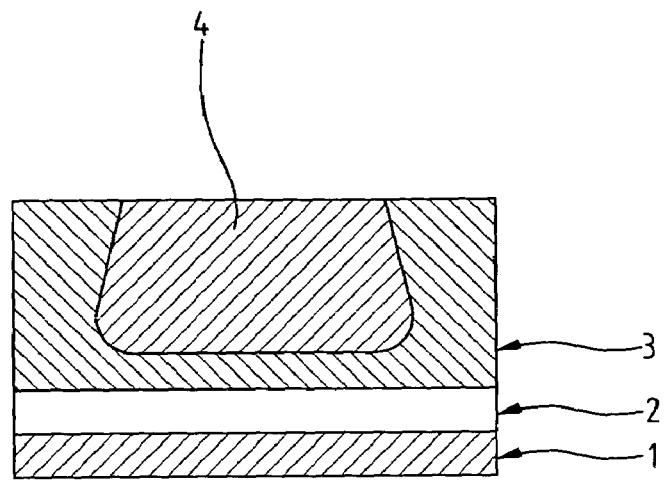

In step 300, the depth and scope of distributing and vegetating ions is controlled by using ion-distribution technology and optimum photomasks, also distributing and vegetating $Si^+$ to the P-type GaN layer 3 completed in foregoing step, and forming a first N-type GaN layer 4, such that the first N-type GaN layer 4 could be extended from the top end of the P-type GaN layer 3 deep into a proper extent thereof as shown in FIG. 5. The N-type GaN layer 4 could be formed alternatively by distributing and vegetating other materials having $O^{2-}$ or $S^{2-}$ ions into the P-type GaN layer 3 without being limited to the ion of a single species.

Figure 6:
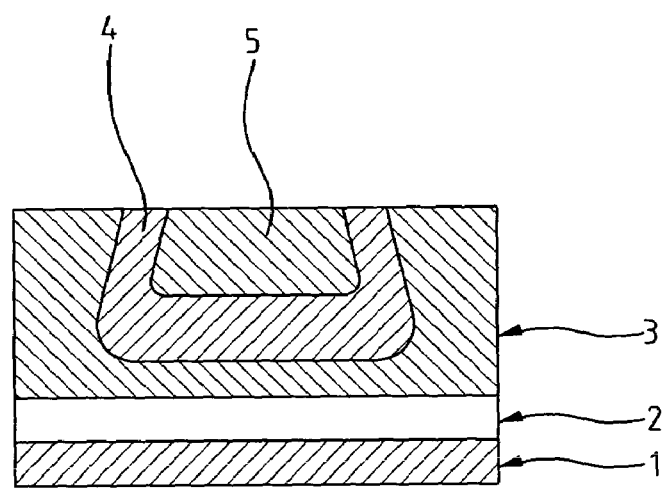

The step 400 is to control the depth and scope of distributing and vegetating ions by using ion-distribution technology and adopting optimum photomasks and vegetation energy, also distribute and vegetate $Si^+$ to the first N-type GaN layer 4 completed in foregoing step, and form a second N-type GaN layer 5, which is capable of releasing more electrons, to be extended from the top end of the first N-type GaN layer 4 deep into a proper extent thereof as shown in FIG. 6. The foregoing second N-type GaN layer 5 could be formed alternatively by distributing and vegetating other materials having $O^{2-}$ or $S^{2-}$ ions into the first N-type GaN layer 4 without being limited to the ion of a single species.

The step 500 is to put the foregoing semi-finished product into a high-temperature furnace for annealing to hence activate the vegetated ions.

The step 600 is to plate an annular metallic layer 6 and another metallic layer 6 on the P-type GaN layer 3 and the second N-type GaN layer 5 separately to serve for a P-type and an N-type ohmic contact electrodes respectively as shown in FIG. 1B, so that the GaN element can be biased externally.

Abovesaid metallic layers 6 could be formed by using any kind of the materials including Ti, Al, Pt, and Au, through proper control of the vapor-plating scope with a photomask.

Basing on the fact that the band gap of GaN material is 3.4 eV approximately, less than the energy of ultraviolet ray, ultraviolet ray will be absorbed by the GaN material of the ultraviolet detector of the present invention to produce an electron-hole pair, and when an incident ultraviolet light beam projects upon a biased GaN material, a photoelectric current could be created. On the contrary, no electron-hole pair and accordingly no photoelectric current would be produced in the case the energy of an incident light beam is smaller than the threshold value, that is 3.4 eV. Therefore, it is understood that the detection element of the present invention is reactive only to ultraviolet ray or other lights with shorter wavelengths. In addition, by taking advantage of ion-distribution-and-vegetation technology, it is possible for the present invention to vegetate an N-type GaN layer in a P-type GaN layer and form a planar structure of parallel P-and N-GaN layers, such that an incident light may project upon a depletion layer of the present invention to promote photon efficiency.

In the above described, at least one preferred embodiment has been described in detail with reference to the drawings annexed, and it is apparent that numerous changes or modifications may be made without departing from the true spirit and scope thereof, as set forth in the claims below.

What is claimed is:

1. An ultraviolet detector, comprised of a baseplate, a buffer layer, and a P-type GaN layer, in which the P-type GaN layer envelops a first N-type GaN layer extended to the top end thereof; the first N-type GaN layer further envelops a second N-type GaN layer also extended to the same top end which is capable of releasing much more electrons; an annular and another metallic layer are formed on the top end in an annular zone between the P-type and the first N-type GaN layer and in a circular zone inside the second N-type metallic layer to form a P-type ohmic contact electrode as well as an N-type ohmic contact electrode respectively.

2. A method for manufacturing ultraviolet detector, comprising the following steps:
   (1) forming a buffer layer on an insulating baseplate by using an epitaxial method;
   (2) forming a P-type GaN layer on the buffer layer by using an epitaxial method;
   (3) distributing and vegetating $Si^+$ ions in the P-type GaN layer completed in foregoing step to form a first N-type GaN layer extending from top end of the P-type GaN layer deep into inside to a predetermined extent to form an optimum scope by way of using ion-distribution-and-vegetation technology and adopting optimum photomasks as well as control of depth and range of distributed and vegetated ions;
   (4) distributing and vegetating $Si^+$ ions in the N-type GaN layer completed in foregoing step to form a second N-type GaN layer capable of releasing much more electrons and extending from top end of the first N-type GaN layer deep into inside to a predetermined extent to form an optimum scope by way of using ion-distribution-and-vegetation technology and adopting optimum photomasks as well as control of depth and range of distributed and vegetated ions;
   (5) putting foregoing semi-finished product into a high-temperature furnace for annealing in order to activate the distributed and vegetated ions; and
   (6) plating an annular and another metallic layer on the P-type GaN layer as well as the second N-type GaN layer, respectively.

3. The method for manufacturing ultraviolet detector according to claim 2, wherein the baseplate is made of an insulating material selected from a group consisting of Si, SiC, GaP, GaAs, GaN and $Al_2O_3$.

4. The method for manufacturing ultraviolet detector according to claim 2, wherein the epitaxial method is any of metal organic chemical vapor deposition (MOCVD), molecular beam epitaxy, vapor phase epitaxy (VPE), or liquid phase epitaxy (LPE).

5. The method for manufacturing ultraviolet detector according to claim 2, wherein the P-type GaN layer is formed by P-type material in form of $Al_xGa_yIn_{(1-x-y)}N$, where $x \geq 0$, $y \geq 0$, $1 \geq x+y \leq 0$.

6. The method for manufacturing ultraviolet detector according to claim 2, wherein the first N-type GaN layer is formed by distributing and vegetating $O^{2-}$ or $S^{2-}$ ions to the P-type GaN layer.

7. The method for manufacturing ultraviolet detector according to claim 2, wherein the second N-type GaN layer is formed by distributing and vegetating $O^{2-}$ or $S^{2-}$ ions to the first N-type GaN layer.

8. The method for manufacturing ultraviolet detector according to claim 2, wherein the metallic layers are formed by Ti, Al, Pt, Au.

* * * * *